US012326663B2

(12) United States Patent
Bolsinger

(10) Patent No.: US 12,326,663 B2
(45) Date of Patent: Jun. 10, 2025

(54) OPTICAL COMPONENT

(71) Applicant: Carl Zeiss SMT GmbH, Oberkochen (DE)

(72) Inventor: Valentin Jonatan Bolsinger, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 281 days.

(21) Appl. No.: 18/187,295

(22) Filed: Mar. 21, 2023

(65) Prior Publication Data

US 2023/0221648 A1 Jul. 13, 2023

Related U.S. Application Data

(63) Continuation of application No. PCT/EP2021/076562, filed on Sep. 28, 2021.

(30) Foreign Application Priority Data

Sep. 30, 2020 (DE) .......................... 102020212367.5

(51) Int. Cl.
*G03F 7/00* (2006.01)
(52) U.S. Cl.
CPC ...... *G03F 7/70158* (2013.01); *G03F 7/70033* (2013.01); *G03F 7/70191* (2013.01); *G03F 7/70575* (2013.01)
(58) Field of Classification Search
CPC ............. G03F 7/70158; G03F 7/70033; G03F 7/70191; G03F 7/70575; G03F 7/7015; G03F 7/70175; G21K 1/067
See application file for complete search history.

(56) References Cited

U.S. PATENT DOCUMENTS 6,462,875 B1 10/2002 Ishii
6,573,978 B1 6/2003 McGuire, Jr.
(Continued)

FOREIGN PATENT DOCUMENTS

AU 2017/202866 A1 5/2017
AU 2017/270014 A1 1/2019
(Continued)

OTHER PUBLICATIONS

German Office Action, with translation thereof, for corresponding DE Appl No. 10 2020 212 367.5, dated Jan. 5, 2021.
(Continued)

*Primary Examiner* — Hung V Nguyen
(74) *Attorney, Agent, or Firm* — Fish & Richardson P.C.

(57) ABSTRACT

An optical component has a diffraction structure for diffractively influencing a direction of emergence of light of at least one wavelength incident on the optical component. The diffraction structure includes at least two diffraction substructures superimposed in at least one portion of the optical component and having first positive diffraction structures and first negative diffraction structures. A first diffraction substructure has first positive diffraction structures and first negative diffraction structures arranged to have a symmetry following a first symmetry condition. A second diffraction substructure has second positive diffraction structures and second negative diffraction structures arranged to have a second symmetry condition differing from the first symmetry condition. This can result in an optical component for which a production of a diffraction structure with a diffraction effect for different target wavelengths and/or an improved diffraction effect for one and the same target wavelength is made more flexible.

20 Claims, 10 Drawing Sheets

(56) References Cited

U.S. PATENT DOCUMENTS

| | | | |
|---|---|---|---|
| 11,194,256 B2* | 12/2021 | Feldmann | G02B 5/1861 |
| 2006/0132747 A1 | 6/2006 | Singer et al. | |
| 2014/0131586 A1 | 5/2014 | Wang et al. | |
| 2017/0112376 A1 | 4/2017 | Gill et al. | |
| 2018/0074303 A1 | 3/2018 | Schwab | |
| 2020/0225586 A1 | 7/2020 | Feldmann et al. | |

FOREIGN PATENT DOCUMENTS

| | | |
|---|---|---|
| DE | 10 2008 009 600 A1 | 8/2009 |
| DE | 10 2016 209 359 A1 | 11/2017 |
| DE | 10 2018 218 981 A1 | 12/2018 |
| DE | 10 2019 200 698 A1 | 12/2019 |
| DE | 10 2019 200 376 A1 | 7/2020 |
| EP | 1 614 008 B1 | 12/2009 |
| WO | WO 2017/202866 A1 | 11/2017 |

OTHER PUBLICATIONS

Translation of International Search Report for corresponding PCT Appl No. PCT/EP2021/076562, dated Jan. 7, 2022.

* cited by examiner

OPTICAL COMPONENT

CROSS-REFERENCE TO RELATED APPLICATIONS

The present application is a continuation of, and claims benefit under 35 USC 120 to, international application PCT/EP2021/076562, filed Sep. 28, 2021, which claims benefit under 35 USC 119 of German Application No. 10 2020 212 367.5, filed Sep. 30, 2020. The entire disclosure of each of these applications is incorporated by reference herein.

FIELD

The disclosure relates to an optical component for use in a projection exposure apparatus for projection lithography, having a diffraction structure for diffractively influencing a direction of emergence of light of at least one wavelength incident on the optical component. The disclosure also relates to such an optical component designed as an EUV collector, an illumination system having such an EUV collector, an optical system having with such an illumination system, a projection exposure apparatus having such an optical system, a method for producing a structured component using such a projection exposure apparatus, and a microstructured or nanostructured component produced with such a method.

BACKGROUND

Optical components for use in a projection exposure apparatus for projection lithography are known from DE 10 2019 200 698 A1, US 2020/0 225 586 A1 and DE 10 2018 218 981 A1. Variants of optical security components that can be used for authentication are known from AU 2017/270 014 A1. U.S. Pat. No. 6,462,875 B1 describes embodiments of diffractive optical elements. US 2017/0 112 376 A1 describes optical sensors with and without lens elements. DE 10 2016 209 359 A1 describes an EUV collector having a mirror surface with surface structures for scattering a used EUV wavelength.

SUMMARY

The present disclosure seeks to further develop an optical component for use in a projection exposure apparatus for projection lithography, in such a way that a production of a diffraction structure with a diffractive effect for different target wavelengths and/or an improved diffractive effect for one and the same target wavelength is made more flexible.

According to the disclosure, it was recognized that, in order to form a diffraction structure with more than two structural levels, it is not absolutely necessary to superimpose diffraction substructures with the same symmetry conditions. Rather, it was recognized that it is advantageous to use diffraction substructures with different symmetry conditions in order to form the diffraction structure having the desired properties.

The symmetry conditions of the two diffraction substructures differ if none of the following criteria are met:
  both diffraction substructures are periodic gratings, each with exactly one grating period running direction;
  both diffraction substructures are structures without any symmetry, for example CGH (computer generated hologram) structures.

Once at least one of these two criteria is met, the diffraction substructures do not have different symmetry conditions.

The following criterion can apply as a further criterion for differing symmetry conditions of the two diffraction substructures:
  both diffraction substructures can be converted into one another by translation.

To the extent that this third criterion should be considered, the diffraction substructures do not have different symmetry conditions as soon as at least one of these three criteria is met.

The use of a plurality of diffraction substructures with different symmetry conditions enables manufacturing simplifications. Moreover, the individual diffraction substructures can be produced with high precision.

At least one of the diffraction substructures can cover an entire optically used area of the optical component, leading to a correspondingly strong diffraction effect. All diffraction substructures can also cover the entire optically used area of the optical component.

The two diffraction substructures may belong to different symmetry classes. Examples of such different symmetry classes are those that are used in the context of the description of crystal systems, that is to say the seven symmetry classes used there for the description (cubic, hexagonal, tetragonal, trigonal, orthorhombic, monoclinic, triclinic).

In an aspect, the disclosure provides an optical component for use in a projection exposure apparatus for projection lithography,
  having a diffraction structure for diffractively influencing a direction of emergence of light of at least one wavelength incident on the optical component,
  wherein the diffraction structure is constructed from at least two superimposed diffraction substructures in at least one portion of the optical component,
  wherein a first of the diffraction substructures is embodied with first positive diffraction structures and first negative diffraction structures, the arrangement of which follows a first symmetry condition,
  wherein a second of the diffraction substructures is embodied with second positive diffraction structures and second negative diffraction structures, the arrangement of which follows a second symmetry condition that differs from the first symmetry condition.

The two diffraction substructures can be configured for diffractively influencing different light wavelengths. Such a diffraction structure can make it possible, for example, to influence the direction of emergence of stray light of different stray light wavelengths using one and the same diffraction structure. Alternatively, it is possible to design the diffraction substructures to diffractively influence one and the same light wavelength. An improvement in diffraction efficiency can be achieved in this case. In this context, reference is made to US 2020/0 225 586 A1.

Examples of designs of the individual diffraction substructures can also be found in DE 10 2019 200 698 A1.

One of the diffraction substructures can be designed as a periodic structure, and the other diffraction substructure can be designed as an aperiodic structure. In such an optical component, different production techniques can be used for the different diffraction substructures (periodic/aperiodic). Alternatively, it is possible to use at least two periodic diffraction substructures or else at least two aperiodic diffraction substructures in the diffraction structure. If at least one periodic diffraction substructure is used, a variability of a structure period or a functional relationship of the structure periodicity is also possible, as is described in DE 10 2018 218 981 A1.

At least one of the diffraction substructures can have a rotational symmetry about a structure origin. In such a diffraction structure, the rotationally symmetric diffraction substructure can have positive diffraction structures and/or negative diffraction structures in the form of circular paths around a structure origin. A rotational symmetry of the diffraction substructure can also be present if a multiple rotational symmetry is present, if the positive diffraction structures and the negative diffraction structures are thus successively transformed in a corresponding plurality of rotation steps in the circumferential direction. A spiral shape of the positive diffraction structures and/or the negative diffraction structures of the diffraction substructure is also possible. The two diffraction substructures of the diffraction structure can be embodied, for example, as counter-rotating spiral path substructures. Concentric, closed paths deviating from a circular path in relation to a structure origin, for example elliptical, square or rectangular paths, are also possible for the profile of the positive diffraction structures and/or the negative diffraction structures. The mutually differing symmetry conditions of two diffraction substructures can also emerge from diffraction substructures which are each formed as positive diffraction structures and/or negative diffraction structures in the form of circular paths around structure origins that are spaced apart from one another. Such a diffraction structure can be understood to be a superposition of diffraction substructures in the form of two mutually offset circular path substructures.

At least one of the diffraction substructures can have a spoke structure arranged around a structure origin. Such a spoke structure was found to be another possible class of diffraction substructures.

At least one of the diffraction substructures can have positive diffraction structures arranged in a grid-like manner and/or negative diffraction structures arranged in a grid-like manner. Such structures were also found to be a possible class for the diffraction substructures. The grid arrangement can be a square grid, a rectangular grid and/or a point grid.

At least one of the diffraction substructures can be embodied as a binary structure. Such a binary structure can lead to a good diffraction result. Such a binary structure is present if a total area of the positive diffraction structures is equal to a total area of the negative diffraction structures of the respective diffraction substructure. The diffraction substructure can be embodied as a blazed structure.

Cross-sectional structural transitions between positive diffraction structures and negative diffraction structures of at least one of the diffraction substructures can have a smooth profile. Such a smooth, for example sinusoidal, profile of cross-sectional structural transitions was found to be particularly effective for certain applications. A smooth profile is present, for example, if the profile of the respective cross-sectional structural transition is continuously differentiable. Such a smooth profile can lead to production-related advantages for the optical component. Diffraction substructures with a smooth profile have no edges in the cross-sectional profile. This simplifies the application of a coating to the diffraction structure, for example a coating that increases the reflectivity of the optical component for used light. Designs of the smooth profile of the diffraction substructures, in which shadowing of the used light incident on the diffraction structure is avoided, are possible. Instead of a smooth profile, for example a sinusoidal profile, a Gaussian profile or a $\sin^2$ profile can also be present for cross-sectional structural transitions between the positive diffraction structures and negative diffraction structures of at least one of the diffraction substructures.

Alternatively, the positive diffraction structures and/or the negative diffraction structures can also have a cross-sectional profile in the form of a rectangular structure, in the form of three sides of a square structure or in the form of a triangular structure. A triangular structure of the cross-sectional profile can be used to generate a blaze diffraction structure.

The optical element can include at least three diffraction substructures. The third of the diffraction substructures can have third positive diffraction structures and third negative diffraction structures, the arrangement of which follows a further symmetry condition which differs from the first symmetry condition and/or or the second symmetry condition. Such a diffraction structure can further expand the possibilities for designing the diffraction structure. The three diffraction substructures can each be designed to diffractively influence different light wavelengths. Structure depths which correspond to a sum of in each case two of the three target wavelengths and a sum of all three target wavelengths may arise. It is also possible to design the three diffraction substructures to diffractively influence one and the same light wavelength. This leads to an improvement in the diffraction efficiency of this light wavelength. Finally, when using three diffraction substructures, it is possible to embody one of the diffraction substructures for diffraction of a first target wavelength and the other two of the diffraction substructures for diffraction of a second target wavelength, which can be adapted in a manner adapted to the properties placed on a diffraction efficiency of the different target wavelengths.

An optical component can be designed as an EUV collector for use in an EUV projection exposure apparatus, wherein the collector is configured to guide EUV used light emitted by a plasma source region, and at least one structured stray light portion of an impingement surface of the collector is configured to lead away stray light radiation by diffraction, the wavelength of the stray light differing from that of the used light. Features of an optical component can be particularly pronounced when present in such an EUV collector.

With an EUV collector designed in this way, it is possible, for example, to avoid thermal effects which would be caused by light of different wavelengths emanating from a light source that should be focused by the collector.

The different wavelengths to be suppressed can be, for example, wavelengths in the infrared spectral range and/or wavelengths in the DUV (deep ultraviolet) spectral range and/or wavelengths in the EUV spectral range.

Features of an illumination system including an optical element according to the disclosure can correspond to those which have already been explained above with reference to the EUV collector according to the disclosure.

The illumination system can be designed with the EUV collector with the diffraction structure embodied as described above so as to result in a homogeneous distribution of the stray light in the region of stray light removal locations and for example in the region of beam dumps provided for this purpose. Alternatively or additionally, it is possible by way of the collector portions embodied as computer generated holograms to ensure an optimal distribution function of the used light for example in specific portions of an illumination beam path of the illumination system, for example in the region of a pupil plane.

The illumination system can be designed with a collector embodied in such a way that a beam diameter of illumination light partial beams in a pupil plane of the illumination optical unit deviates from a circular shape so slightly that the beam diameter deviates by less than 20% from a mean diameter independently of the direction in which this diameter is measured, that is to say it substantially has a circular diameter.

Features of corresponding optical systems, projection exposure apparatus, production methods and microstructured or nanostructured components can correspond to those which have already been explained above with reference to the collector according to the disclosure.

For example, a semiconductor component, such as a memory chip, can be produced using the projection exposure apparatus.

BRIEF DESCRIPTION OF THE DRAWINGS

Below, at least one exemplary embodiment of the disclosure is described on the basis of drawings, in which.

DETAILED DESCRIPTION

Figure 1:
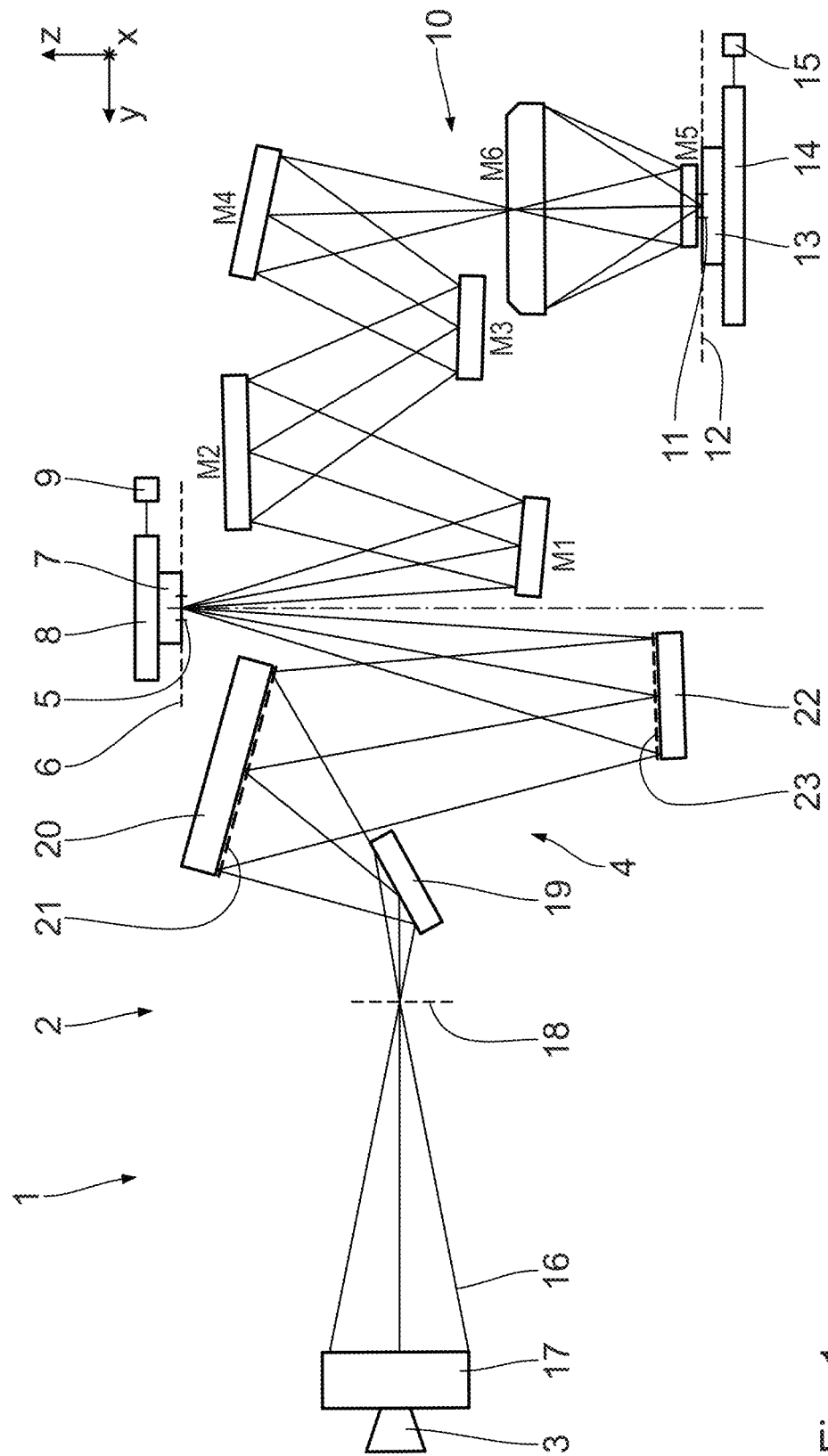
FIG. 1 schematically shows a meridional section of a projection exposure apparatus for EUV projection lithography.

Certain parts of a microlithographic projection exposure apparatus 1 are described in an exemplary fashion below initially with reference to FIG. 1. The description of the projection exposure apparatus 1 and its components should not be construed as limiting here.

One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 can also be provided as a module separate from the rest of the illumination system. In this case, the illumination system does not comprise the light source 3.

A reticle 7 arranged in the object field 5 is exposed. The reticle 7 is held by a reticle holder 8. The reticle holder 8 is displaceable by way of a reticle displacement drive 9, for example in a scanning direction.

A Cartesian xyz-coordinate system is shown in FIG. 1 for explanation purposes. The x-direction runs perpendicular to the plane of the drawing into the latter. The y-direction runs horizontally and the z-direction runs vertically. The scanning direction runs in the y-direction in FIG. 1. The z direction runs perpendicularly to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle that differs from 0° between the object plane 6 and the image plane 12 is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example in the y-direction. The displacement, firstly, of the reticle 7 by way of the reticle displacement drive 9 and, secondly, of the wafer 13 by way of the wafer displacement drive 15 can be implemented so as to be synchronized with one another.

The radiation source 3 is an EUV radiation source. The radiation source 3 emits, for example, EUV radiation 16, which is also referred to below as used radiation, illumination radiation or illumination light. For example, the used radiation has a wavelength in the range of between 5 nm and 30 nm. The radiation source 3 can be a plasma source, for example an LPP (laser produced plasma) source or a GDPP (gas discharge produced plasma) source. It may also be a synchrotron-based radiation source. The radiation source 3 may be a free electron laser (FEL).

The illumination radiation 16 emerging from the radiation source 3 is focused by a collector 17. The collector 17 may be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 may be structured and/or coated on the one hand for optimizing its reflectivity for the used radiation and on the other hand for suppressing stray light. Details on this are explained below with reference to FIG. 2 et seq.

The illumination radiation 16 propagates through an intermediate focus in an intermediate focal plane 18 downstream of the collector 17. The intermediate focal plane 18 can represent a separation between a radiation source module, having the radiation source 3 and the collector 17, and the illumination optical unit 4.

The illumination optical unit 4 comprises a deflection mirror 19 and, arranged downstream thereof in the beam path, a first facet mirror 20. The deflection mirror 19 may be a plane deflection mirror or, alternatively, a mirror with a beam-influencing effect that goes beyond the purely deflecting effect. Alternatively or in addition, the deflection mirror 19 may be in the form of a spectral filter that separates a used light wavelength of the illumination radiation 16 from stray light of a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which are also referred to below as field facets. FIG. 1 depicts only some of the facets 21 by way of example.

The first facets 21 may be embodied as macroscopic facets, for example as rectangular facets or as facets with an arcuate edge contour or an edge contour of part of a circle. The first facets 21 may be embodied as plane facets or alternatively as facets with convex or concave curvature.

As known for example from DE 10 2008 009 600 A1, the first facets 21 themselves may also be composed in each case of a multiplicity of individual mirrors, for example a multiplicity of micromirrors. The first facet mirror 20 may for example be formed as a microelectromechanical system (MEMS system). For details, reference is made to DE 10 2008 009 600 A1.

The illumination radiation 16 travels horizontally, that is to say in the y-direction, between the collector 17 and the deflection mirror 19.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 may also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 may likewise be macroscopic facets, which may for example be a round, rectangular or else hexagonal boundary, or may alternatively be facets composed of micromirrors. In this regard, reference is likewise made to DE 10 2008 009 600 A1.

The second facets 23 may have plane reflection surfaces or alternatively reflection surfaces with convex or concave curvature.

The illumination optical unit 4 consequently forms a doubly faceted system. This fundamental principle is also referred to as a fly's eye condenser (fly's eye integrator).

It may be advantageous to arrange the second facet mirror 22 not exactly in a plane that is optically conjugate to a pupil plane of the projection optical unit 10.

With the aid of the second facet mirror 22, the individual first facets 21 are imaged into the object field 5. The second facet mirror 22 is the last beam shaping mirror or, in fact, the last mirror for the illumination radiation 16 in the beam path upstream of the object field 5.

In a further embodiment, not shown, of the illumination optical unit 4, a transfer optical unit contributing for example to the imaging of the first facets 21 into the object field 5 may be arranged in the beam path between the second facet mirror 22 and the object field 5. The transfer optical unit may have exactly one mirror, or alternatively have two or more mirrors, which are arranged one behind the other in the beam path of the illumination optical unit 4. The transfer optical unit can for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the field facet mirror 20 and the pupil facet mirror 22.

The deflection mirror 19 can also be dispensed with in a further embodiment of the illumination optical unit 4, and so the illumination optical unit 4 can then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is, as a rule, only approximate imaging.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve or any other number of mirrors Mi are likewise possible. The penultimate mirror M5 and the last mirror M6 each have a passage opening for the illumination radiation 16. The projection optical unit 10 is a twice-obscured optical unit. The projection optical unit 10 has an image-side numerical aperture which is greater than 0.5 and which may also be greater than 0.6 and, for example, can be 0.7 or 0.75.

Reflection surfaces of the mirrors Mi may be embodied as free-form surfaces without an axis of rotational symmetry. Alternatively, the reflection surfaces of the mirrors Mi may be designed as aspheric surfaces with exactly one axis of rotational symmetry of the reflection surface shape. Just like the mirrors of the illumination optical unit 4, the mirrors Mi may have highly reflective coatings for the illumination radiation 16. These coatings may be designed as multilayer coatings, for example with alternating layers of molybdenum and silicon.

The projection optical unit 10 has a large object-image offset in the y-direction between a y-coordinate of a center of the object field 5 and a y-coordinate of the center of the image field 11. This object-image offset in the y-direction can be of approximately the same magnitude as a z-distance between the object plane 6 and the image plane 12.

For example, the projection optical unit 10 can have an anamorphic embodiment. For example, it has different imaging scales $\beta_x$, $\beta_y$ in the x- and y-directions. The two imaging scales $\beta_x$, $\beta_y$ of the projection optical unit 7 can be at $(\beta_x, \beta_y)=(+/-0.25, /+-0.125)$. A positive imaging scale $\beta$ means imaging without image inversion. A negative sign for the imaging scale $\beta$ means imaging with image inversion.

The projection optical unit 10 consequently leads to a reduction in size with a ratio of 4:1 in the x-direction, that is to say in a direction perpendicular to the scanning direction.

The projection optical unit 10 leads to a reduction in size of 8:1 in the y-direction, that is to say in the scanning direction.

Other imaging scales are likewise possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 5 and the image field 11 can be the same or, depending on the embodiment of the projection optical unit 10, can differ. Examples of projection optical units with different numbers of such intermediate images in the x- and y-directions are known from US 2018/0074303 A1.

In each case one of the pupil facets 23 is assigned to exactly one of the field facets 21 for forming in each case an illumination channel for illuminating the object field 5. For example, this can yield illumination according to the Köhler principle. The far field is decomposed into a multiplicity of object fields 5 with the aid of the field facets 21. The field facets 21 generate a plurality of images of the intermediate focus on the pupil facets 23 respectively assigned thereto.

By way of an assigned pupil facet 23, the field facets 21 are imaged in each case onto the reticle 7 in a manner superposed on one another for the purposes of illuminating the object field 5. The illumination of the object field 5 is for example as homogeneous as possible. It can have a uniformity error of less than 2%. The field uniformity may be achieved by way of the overlay of different illumination channels.

The illumination of the entrance pupil of the projection optical unit 10 can be defined geometrically by way of an arrangement of the pupil facets. The intensity distribution in the entrance pupil of the projection optical unit 10 can be set by selecting the illumination channels, for example the subset of the pupil facets which guide light. This intensity distribution is also referred to as illumination setting.

A pupil uniformity in the region of sections of an illumination pupil of the illumination optical unit 4 that are illuminated in a defined manner can be achieved by a redistribution of the illumination channels.

Further aspects and details of the illumination of the object field 5 and for example of the entrance pupil of the projection optical unit 10 are described below.

The projection optical unit 10 may have for example a homocentric entrance pupil. The latter may be accessible. It may also be inaccessible.

The entrance pupil of the projection optical unit 10 regularly cannot be exactly illuminated using the pupil facet mirror 22. In the case of imaging of the projection optical unit 10 which telecentrically images the center of the pupil facet mirror 22 onto the wafer 13, the aperture rays often do not intersect at a single point. However, it is possible to find an area in which the distance of the aperture rays determined in pairs becomes minimal. This area represents the entrance pupil or an area in real space that is conjugate thereto. For example, this area has a finite curvature.

It may be the case that the projection optical unit 10 has different poses of the entrance pupil for the tangential beam path and for the sagittal beam path. In this case, an imaging element, for example an optical component part of the transfer optical unit, should be provided between the second facet mirror 22 and the reticle 7. With the aid of this optical element, the different poses of the tangential entrance pupil and the sagittal entrance pupil may be taken into account.

In the arrangement of the components of the illumination optical unit 4 illustrated in FIG. 1, the pupil facet mirror 22 is arranged in an area conjugate to the entrance pupil of the projection optical unit 10. The field facet mirror 20 is arranged such that it is tilted with respect to the object plane 5. The first facet mirror 20 is arranged in tilted fashion with respect to an arrangement plane defined by the deflection mirror 19.

The first facet mirror 20 is arranged such that it is tilted with respect to an arrangement plane that is defined by the second facet mirror 22.

Figure 2:
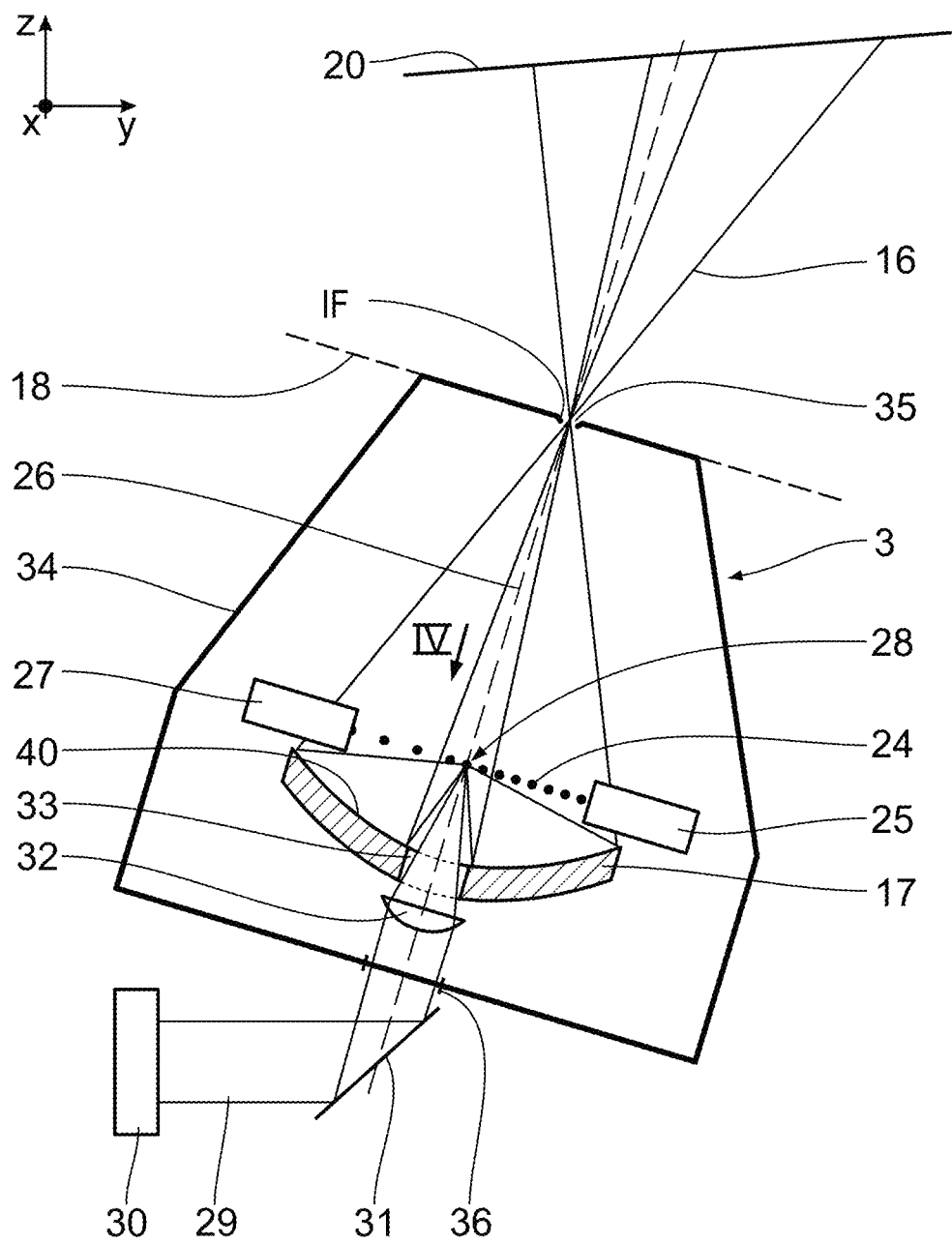
FIG. 2 shows details of a light source of the projection exposure apparatus in the environment of an EUV collector for guiding EUV used light from a plasma source region to a field facet mirror of an illumination optical unit of the projection exposure apparatus, with the EUV collector being illustrated in a meridional section.

FIG. 2 shows details of the light source 3. Components and functions corresponding to those which have already been explained above with reference to FIG. 1 bear the same reference signs and will not be discussed in detail again.

The light source 3 is an LPP (laser produced plasma) source. For the purposes of generating plasma, tin droplets 24 are generated as a continuous droplet sequence by a tin droplet generator 25. A trajectory of the tin droplets 24 runs transversely to a principal ray direction 26 of the EUV used light 16. Here, the tin droplets 24 drop freely between the tin droplet generator 25 and a tin capturing device 27, with the droplets passing through a plasma source region 28. The EUV used light 16 is emitted by the plasma source region 28. When the tin droplet 24 arrives in the plasma source region 28, pump light 29 from a pump light source 30 impinges on the tin droplet. The pump light source 30 can be an infrared laser source in the form of, e.g., a $CO_2$ laser. A different IR laser source is also possible, for example a solid-state laser, for example an Nd:YAG laser.

The pump light 29 is transferred into the plasma source region 28 by way of a mirror 31, which can be a mirror that is tiltable in a controlled fashion, and by way of a focusing lens element 32. A plasma emitting the EUV used light 16 is generated by the pump light impingement from the tin droplet 24 arriving in the plasma source region 28. A beam path of the EUV used light 16 is illustrated in FIG. 2 between the plasma source region 28 and the field facet mirror 20, which is only hinted at in terms of pose and arrangement in FIG. 2, to the extent that the EUV used light 16 is reflected by the collector mirror 17, which is also referred to as EUV collector 17. The EUV collector 17 comprises a central passage opening 33 for the pump light 29 focused toward the plasma source region 28 by way of the focusing lens element 32. The collector 17 is embodied as an ellipsoid mirror and transfers the EUV used light 16 emitted by the plasma source region 28, which is arranged at one ellipsoid focus, to an intermediate focus IF of the EUV used light 16, which is arranged in the intermediate focal plane 18 at the other ellipsoid focus of the collector 17.

The field facet mirror 20 is arranged downstream of the intermediate focus IF in the beam path of the EUV used light 16, in the region of a far field of the EUV used light 16.

The EUV collector 17 and further components of the light source 3, which may be the tin droplet generator 25, the tin capturing device 27 and the focusing lens element 32, are arranged in a vacuum housing 34. The vacuum housing 34 has a passage opening 35 in the region of the intermediate focus IF. In the region of an entrance of the pump light 29 into the vacuum housing 34, the latter comprises a pump light entrance window 36.

Figure 3:
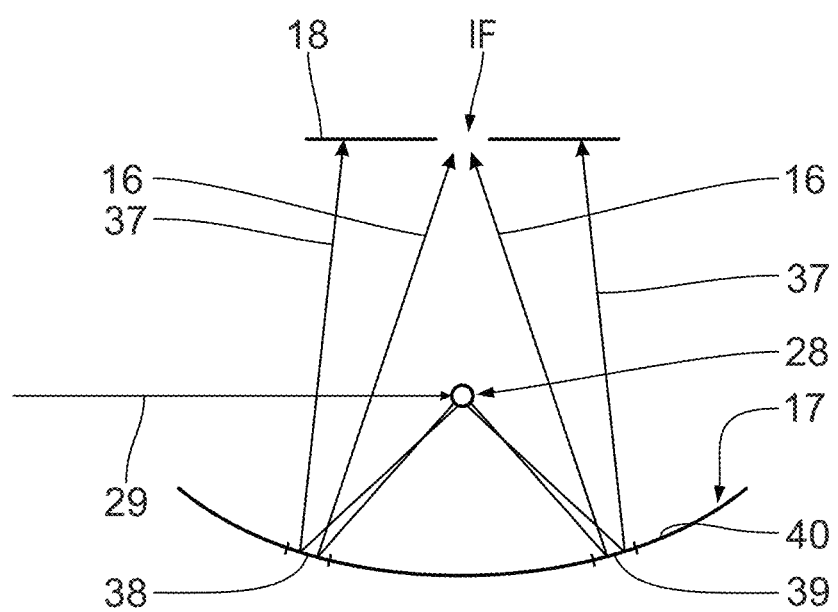
FIG. 3 shows, in a more abstract illustration in comparison with FIG. 2, guidance firstly of EUV used light and secondly of stray light of a different wavelength in the case of reflection/diffraction at the EUV collector.

FIG. 3 shows highly abstractly guidance firstly of EUV used light, that is to say the illumination light 16, and secondly of stray light 37, for example of radiation of longer wavelength, for example IR radiation, between the plasma source region 28 of the light source 3 and the intermediate focal plane 18, in which the intermediate focus IF is arranged. At the same time FIG. 3 shows a variant of lateral guidance of the pump light 29 to the plasma source region 28, that is to say guidance which does not require a passage opening of the type of the passage opening 33 in the EUV collector 17. Both the used light 3 and the stray light 37 emanate from the plasma source region 28. Both the used light 3 and the stray light 37 are incident on stray light portions 38, 39 of an entire impingement surface 40 of the EUV collector 17. The stray light portions/stray light additional portions 38, 39 each serve to lead away the stray light radiation 37. The impingement surface 40 can have precisely one stray light portion 31. The impingement surface 40 can have precisely one stray light additional portion 38, 39.

The stray light portion 38 or 39 can extend over the entire impingement surface 40

The stray light portion 38, 39 is designed to lead away the stray light radiation 37 by diffraction.

For this purpose, the stray light portion 38, 39 of the collector 17 is embodied as a diffraction structure for diffractively influencing a direction of emergence of the illumination light 16 and/or the stray light 37, that is to say for diffractively influencing a direction of emergence of light of at least one wavelength incident on the collector 17. Exemplary embodiments of diffraction substructures from which this diffraction structure of the collector 17 is constructed are explained below with reference to FIG. 4 et seq. Components and functions corresponding to those which have already been explained above with reference to FIGS. 1 to 3 bear the same reference signs where desired and will not be discussed in detail again.

Figure 4:
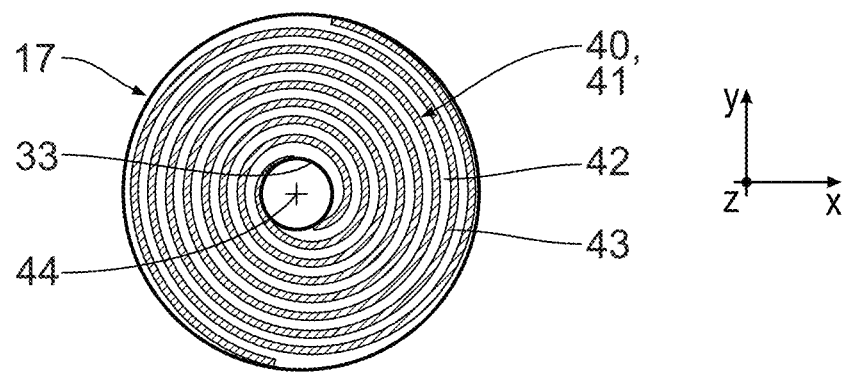
FIGS. 4 to 14 show, each in a plan view, exemplary embodiments of diffraction substructures of a diffraction structure having at least two such diffraction substructures superimposed on one another, for diffractively influencing a direction of emergence of light of at least one wavelength incident on an optical component, of which the EUV collector is an example, with these exemplary embodiments being representatives of arrangements of positive diffraction structures and negative diffraction structures which have different symmetry conditions.

FIG. 4 shows a plan view of the collector 17 from viewing direction IV in FIG. 2.

The entire impingement surface 40 of the collector 17 is embodied as a stray light portion. A diffraction substructure 41 on the entire impingement surface 40 has positive diffraction structures 42 and negative diffraction structures 43, the latter shown with hatching. The diffraction substructure 41 is designed in the form of a spiral path around a structure origin 44 which, in the embodiment of the collector 17 with the passage opening 33, lies centrally in the latter. The pitch of the spirals of the spiral path of the diffraction substructure 41 can be so large that between an inner boundary of the impingement surface 40, which at the same time represents the outer boundary of the passage opening 33, and an outer boundary of the impingement surface 40, between 5 and several thousand such individual paths, that is to say radially successive positive diffraction structures 42 and negative diffraction structures 43, are present. Overall, there can be between one and 100 000 individual paths, for example between 100 and 30 000 individual paths, for the respective diffraction substructure 41.

The diffraction substructure 41 can be described as a two-dimensional, binary structure $A_n(x, y)$. A maximum depth, that is to say a maximum z-extent between the negative diffraction structures 43 and the positive diffraction structures 42, is $\lambda_n/4c$.

$\lambda_n$ (n=1, ... N) is the wavelength or one of the wavelengths of the stray light 37 to be suppressed. x, y are the spatial coordinates of the collector.

c is a position-dependent function that includes a position-dependent index of refraction, $n(x,y)$, and a position-dependent angle of incidence, $\theta_i(x, y)$ of the light to be influenced with regard to its direction of emergence perpendicular to an incidence plane x, z.

$$c(x,y) = \theta_i(x,y) n(x,y) \quad (1)$$

The diffraction substructure 41 generates the following intensity image $I(\lambda, k)$ in the far field, that is to say for example in the intermediate focal plane 18 at a distance D from the impingement surface 40, for any desired wavelength $\lambda$:

$$I(\lambda, k) = \left| \int_{-\infty}^{\infty} \int_{-\infty}^{\infty} e^{irk} e^{i4\pi c(x,y) \frac{A_n(x,y)}{\lambda}} dx dy \right|^2 = |FT[f_n]|^2 \quad (2)$$

Here, k is the wave vector of the incident light;

r is the position vector $r=(x,y)^T$. Here, "T" indicates that the vector is a transposed vector, so that line notation is also possible here.

FT: Fourier transform of the phase function $$f_n := f_n(x, y) = e^{i4\pi c(x,y) \frac{A_n(x,y)}{\lambda}}$$

By superimposing at least two diffraction substructures in the manner of the diffraction substructure 41, for example by superimposing diffraction substructures whose structural arrangements follow different symmetry relationships, the direction of emergence of light of a plurality of wavelengths incident on the diffraction structure of the collector 17 comprising these diffraction substructures is influenced or a possibly improved suppression of incident light of one wavelength is achieved. In general, the superposition $A(x, y)$ of a number N of such structures $A_n(x, y)$ (n=1, ... N) can be written as:

$$A(x,y) = \sum_{n=1}^{N} A_n(x,y) \quad (3)$$

The following then follows for the intensity distribution in the far field for the diffraction structure arising from the superposition:

$$I(\lambda, k) = \left| \int_{-\infty}^{\infty} \int_{-\infty}^{\infty} e^{irk} e^{i4\pi c(x,y) \frac{A_n(x,y)}{\lambda}} dx dy \right|^2 = |FT[f_1] * FT[f_2] * ... * FT[f_N]|^2 \quad (4)$$

where * denotes a convolution operator.

The respective diffraction substructure, for example the diffraction substructure 41 according to FIG. 4, may be given in Cartesian coordinates, $A_n(x, y)$, or in polar coordinates, $A_n(r, \varphi)$.

The respective diffraction substructure $A_n$ can be periodic, that is to say it can have a periodically repeating sequence of positive diffraction structures and negative diffraction structures. An intensity image of the diffraction substructure $A_n$ in the far field, for example in the arrangement region of the field facet mirror, can have discrete intensity maxima.

A periodicity of the positive diffraction structures/negative diffraction structures of the respective diffraction substructure $A_n$ can satisfy a functional relationship. More generally, a structure period T can vary over the respective stray light portion 38, 39 or the entire impingement surface 40. In this regard, reference is made to DE 10 2018 218 981 A1, where corresponding variations of a structure period T are described.

The respective diffraction substructure can also be embodied to be aperiodic.

Like in the example of the diffraction substructure 41 according to FIG. 4, the respective diffraction substructure can be embodied as a binary structure. In such a binary structure, an area of the positive diffraction structures, integrated over an entire area of the respective stray light portion 38, 39, is just as large as an area of the negative diffraction structures arranged there. Alternatively or additionally, the diffraction substructure can be embodied as a blaze structure.

A height profile of the positive diffraction structures 42 and/or negative diffraction structures 43 can have a rectangular structure profile. Cross-sectional structural transitions between the positive diffraction structures and the negative diffraction structures 43 of the diffraction substructure 41, seen for example in a radial cross section, starting from the structure origin 44, are then embodied with a rectangular profile. Alternatively, a triangular profile corresponding to the cross-sectional structural transitions or else a sinusoidal profile corresponding to the cross-sectional structural transitions between the positive diffraction structures and the negative diffraction structures of the diffraction substructure is also possible.

Further variants of diffraction substructures are described below with reference to FIGS. 5 to 16. At least two of these diffraction substructures, the arrangement of which follow different symmetry conditions, can, when superimposed, form an entire diffraction structure either for diffractively influencing different target wavelengths or for diffractively influencing one and the same target wavelength better. Components and functions corresponding to those which have already been explained above with reference to FIGS. 1 to 4 are provided with the same reference signs and will not be discussed in detail again.

Figure 5:
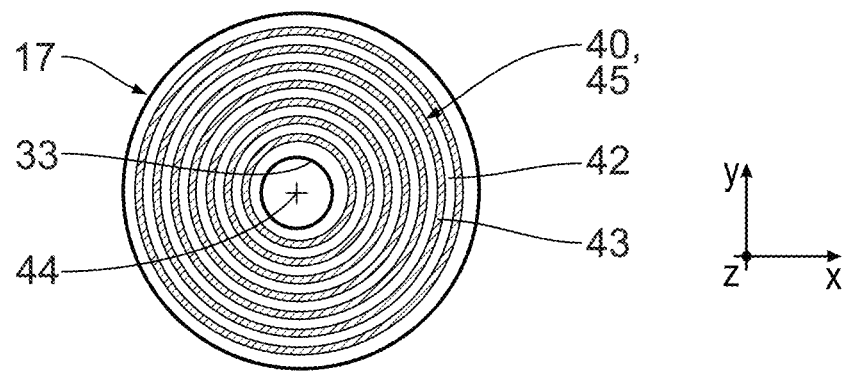

A diffraction substructure 45 according to FIG. 5 has positive diffraction structures 42 and negative diffraction structures 43, which are arranged in the form of circular paths concentric around the structure origin 44 on the entire impingement surface 40. A depth of the negative diffraction structures 43, as measured from a level of the positive diffraction structures, is $\lambda_i/4c$, where $\lambda_i$ is the target wavelength and c is as defined above.

Figure 6:
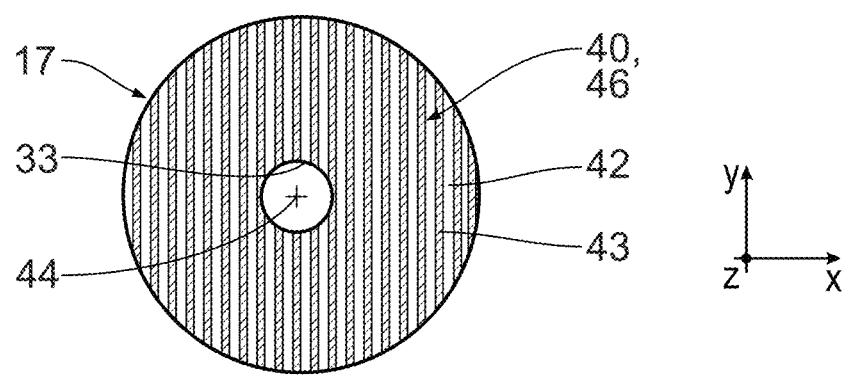

FIG. 6 shows a further variant of a diffraction substructure 46 in the form of positive diffraction structures 42 extending perpendicularly, that is to say along the y-direction, between which negative diffraction structures 43 likewise extend perpendicularly.

A direction of extent of the positive diffraction structures 42 and the negative diffraction structures 43 can also be horizontal or oblique to the x/y coordinate axes in an alternative arrangement to that in FIG. 6.

Figure 7:
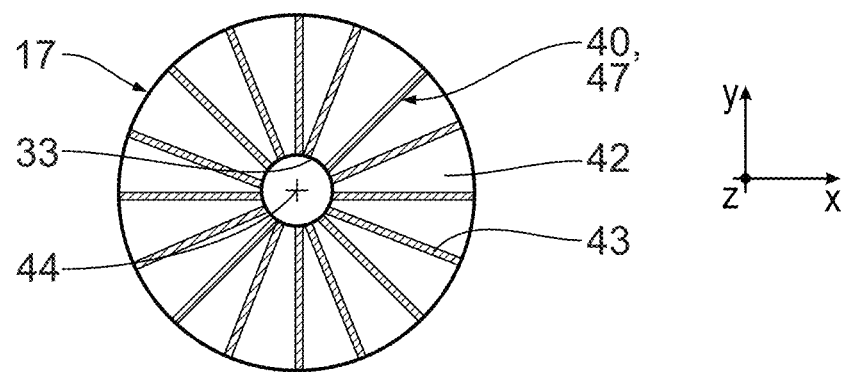

FIG. 7 shows another variant of a diffraction substructure 47. The negative diffraction structures 43 are embodied in the form of spokes extending radially to the structure origin 44, extending between which spokes there are circular sector-shaped positive diffraction structures 42 The number of negative diffraction structures 43 can range between 4 and 30 000, for example range between 10 and 10 000 or range between 100 and 5000.

There are exactly sixteen negative diffraction structures 43 in the embodiment according to FIG. 7.

Figure 8:
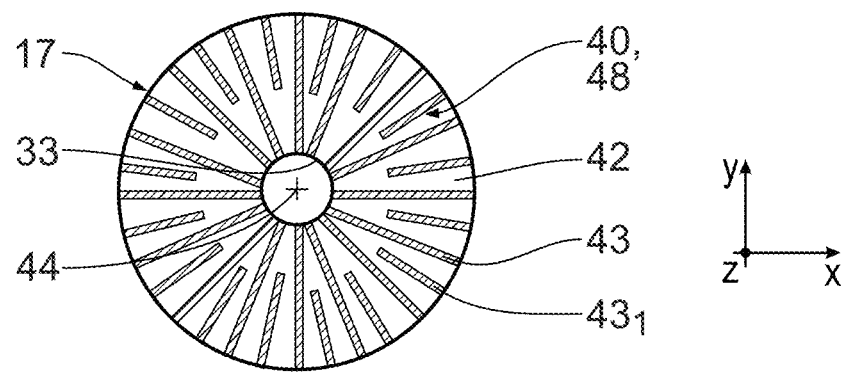

FIG. 8 shows another embodiment of a diffraction substructure 48. In addition to the radially continuous negative diffraction structures 43, which are arranged like in the diffraction substructure 47 according to FIG. 7, the diffraction substructure 45 also has a second type of negative diffraction structures 43$_1$ in the form of non-continuous spokes. These spokes 43$_1$ in turn extend radially to the structure origin 44 and begin at about half the radius of the entire impingement surface 40. The negative diffraction structures 43$_1$ extend radially outward to the outer edge of the entire impingement surface 40.

Figure 9:
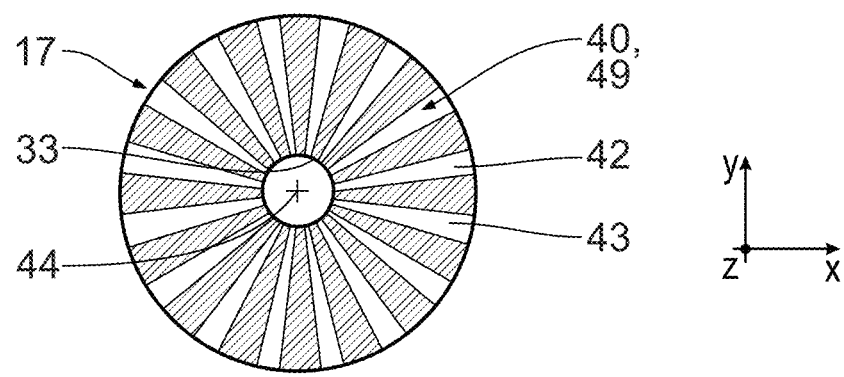

FIG. 9 shows another embodiment of a diffraction substructure 49. In this case, both the positive diffraction structures 42 and the negative diffraction structures 43 are designed to be circular sector-shaped in relation to the structure origin 44. Here, too, there are sixteen positive diffraction structures 42 and sixteen negative diffraction structures 43, like in the embodiment according to FIG. 7.

Figure 10:
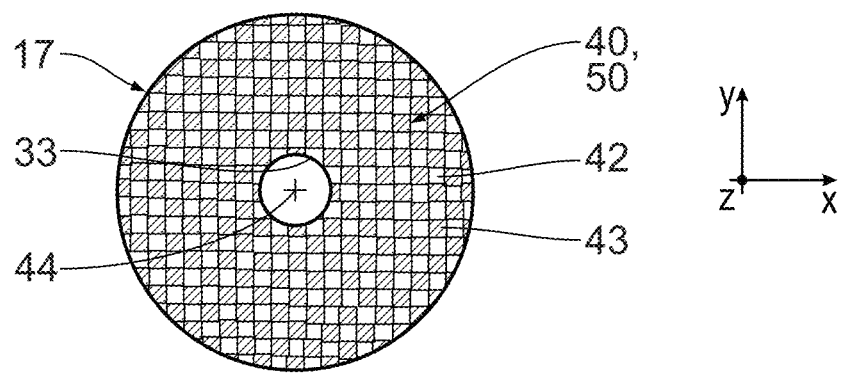

FIG. 10 shows another embodiment of a diffraction substructure 50. The positive diffraction structures 42 and the negative diffraction structures 43 of the diffraction substructure 50 are arranged in a grid-like manner in the manner of a regular square grid. In the diffraction substructure 50, the sequence of the positive diffraction structures 42 and the negative diffraction structures 43 is like that of the white and black fields of a checkerboard. In the case of the diffraction substructure 50, a structure period of a sequence of the positive diffraction structures 42 and the negative diffraction structures 43 can be approximately as large as a structure period, measured in the radial direction, of the diffraction substructures 41, 45 according to FIGS. 4 and 5 or as a structure period, measured in the horizontal direction (x-direction), of the diffraction substructure 46 according to FIG. 6 or as a structure period, measured in the circumferential direction around the structure origin 44, of the diffraction substructures 47 to 49 according to FIGS. 7 to 9.

Figure 11:
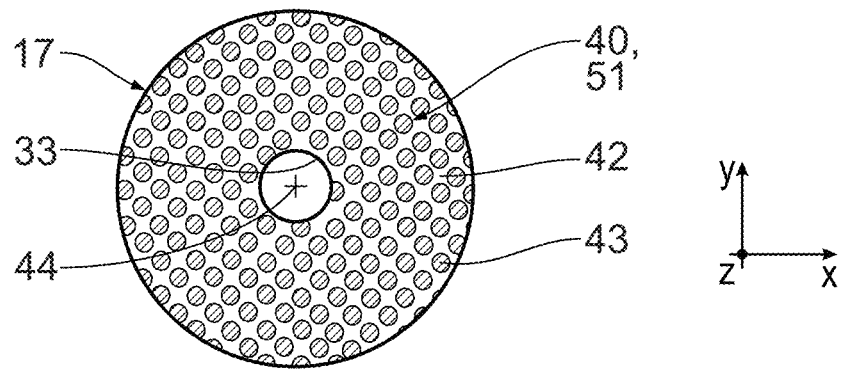

FIG. 11 shows another embodiment of a diffraction substructure 51. The negative diffraction structures 43 are arranged as a Cartesian point grid. The positive diffraction structures 42 then emerge between the punctiform negative diffraction structures 43. What was stated above, for example in relation to the structure period of the diffraction substructure 50 according to FIG. 10, applies to a typical spacing of the negative diffraction structures 43 of the diffraction substructure 51 according to FIG. 11.

Figure 12:
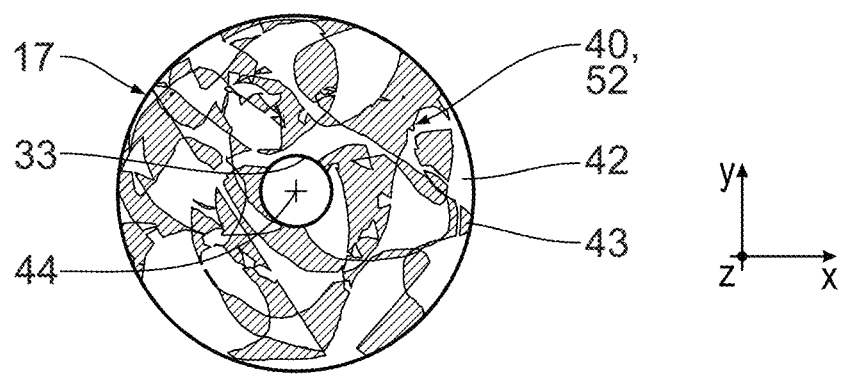

FIG. 12 shows another embodiment of a diffraction substructure 52. The latter is embodied as a computer-generated hologram (CGH) with positive diffraction structures 42 and negative diffraction structures 43, which follow an aperiodic profile. In the case of the diffraction substructure 52, a total area of the positive diffraction structures 42 is as large as a total area of the negative diffraction structures 43, with the result that a binary diffraction substructure 52 emerges overall.

Figure 13:
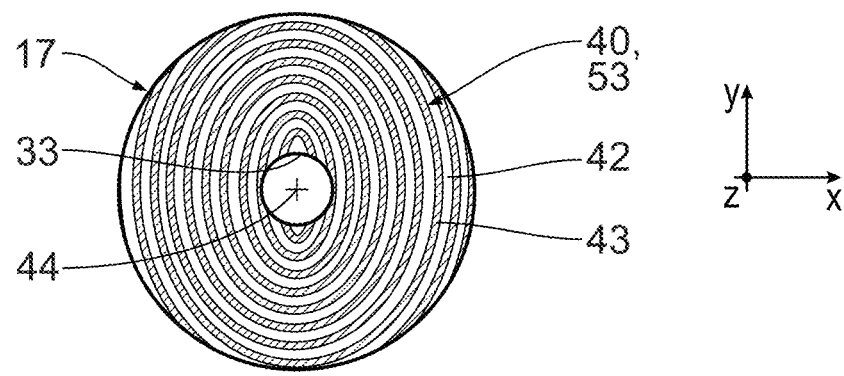

FIG. 13 shows another embodiment of a diffraction substructure 53. The negative diffraction structures 43 of this diffraction substructure 53 are embodied as elliptical paths that run around the structure origin 44 as the center. A semi-axis of the elliptical paths 43 can be larger in the y-direction than in the x-direction.

What has already been explained above for the other versions of the diffraction substructures applies to a structure period of a sequence of, firstly, the positive diffraction structures 42 lying between the negative diffraction structures 43 and, secondly, the negative diffraction structures 43.

Figure 14:
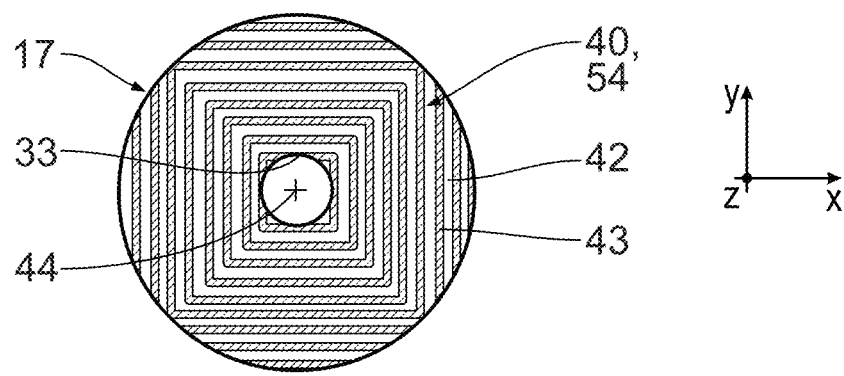

FIG. 14 shows another embodiment of a diffraction substructure 54. The negative diffraction structures 43 of this diffraction substructure 54 are embodied in the form of square paths whose centers coincides with the structure origin 44 in each case. The positive diffraction structures 42 are in turn arranged between these negative diffraction structures 43 extending along square paths. Here, too, a structure period can correspond to those of the diffraction substructures explained above.

Figure 15:
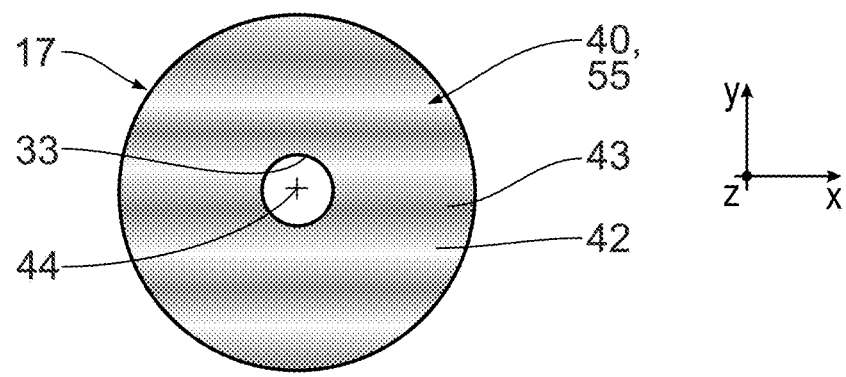
FIGS. 15 and 16 show, each in a plan view again, two examples of diffraction substructures with cross-sectional structural transitions between positive diffraction structures and negative diffraction structures, with these cross-sectional structural transitions having a sinusoidal profile.

FIG. 15 shows another embodiment of a diffraction substructure 55. The negative diffraction structures 43 and the interposed positive diffraction structures 42 extend along horizontal paths, that is to say along paths which run in the x-direction. Cross-sectional structural transitions between the positive diffraction structures 42 and the negative diffraction structures 43, that is to say the structure cross sections viewed in a sectional plane parallel to the yz plane, have a sinusoidal profile, which is indicated in FIG. 15 by corresponding shading.

Figure 16:
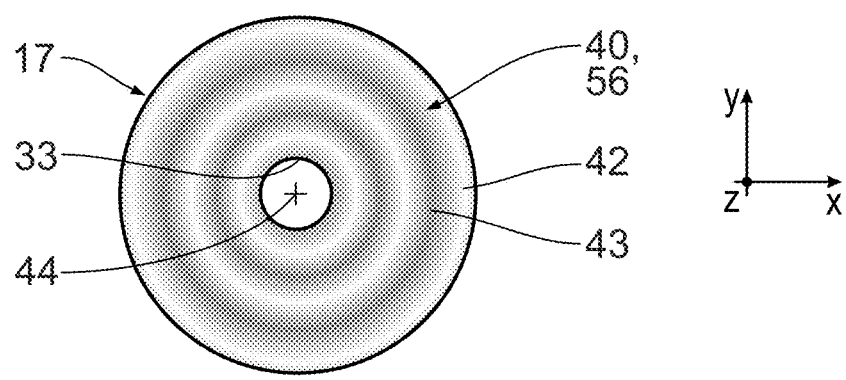

FIG. 16 shows another embodiment of a diffraction substructure 56. Negative diffraction structures 43 of this diffraction substructure 56 have a circular path, comparable to the embodiment according to FIG. 5, with a respective positive diffraction structure 42 once again being arranged between adjacent negative diffraction structures 43. In the embodiment according to FIG. 16, radial cross-sectional structural transitions between the positive diffraction structures 42 and the negative diffraction structures 43 have a sinusoidal profile corresponding to what was explained above, for example in connection with FIG. 15.

Figure 17:
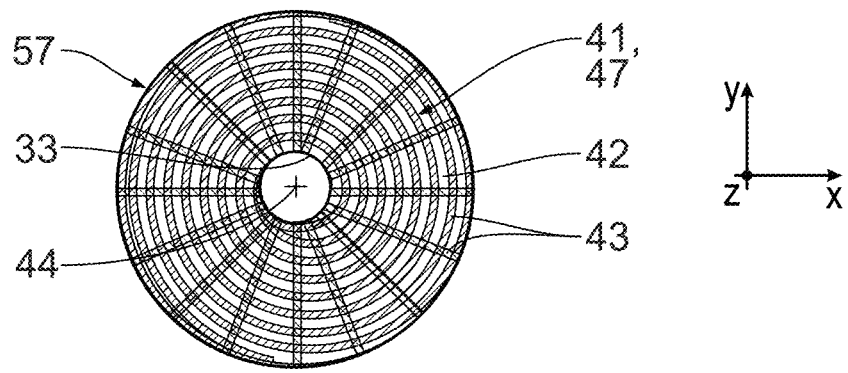
FIGS. 17 to 20 show, each in a top view again, examples of diffraction structures for the optical component with two superimposed diffraction substructures, which each have positive diffraction structures and negative diffraction structures, with the arrangement of these structures in the two diffraction substructures following different symmetry conditions.

FIG. 17 shows one of the possible examples of a diffraction structure 57 formed as a superposition of two diffraction substructures, namely the diffraction substructure 41 according to FIG. 4 with the spoke-shaped positive/negative structures and the diffraction substructure 47 according to FIG. 7 with the spoke-shaped positive/negative structures. Other combinations of at least two diffraction substructures, which were explained above for example with reference to FIGS. 4 to 16, are also possible for forming the diffraction structure and are described below with reference to FIGS. 18 to 21.

In each case, at least two diffraction substructures are combined, the positive diffraction/negative diffraction structural arrangements of which follow different symmetry conditions. These symmetry conditions differ if none of the following criteria are met:
- both diffraction substructures are periodic gratings, each with exactly one grating period running direction;
- both diffraction substructures are structures without any symmetry, for example CGH structures;
- both diffraction substructures can be converted into one another by translation.

For the combination of the two diffraction substructures 41, 47 to form the diffraction structure 57, none of these three criteria above is met, and so the symmetry conditions of the two diffraction substructures 41, 47 therefore differ.

The two diffraction substructures may belong to different symmetry classes. Examples of such different symmetry classes are those that are used in the context of the description of crystal systems, that is to say the seven symmetry classes used there for the description (cubic, hexagonal, tetragonal, trigonal, orthorhombic, monoclinic, triclinic).

Figure 18:
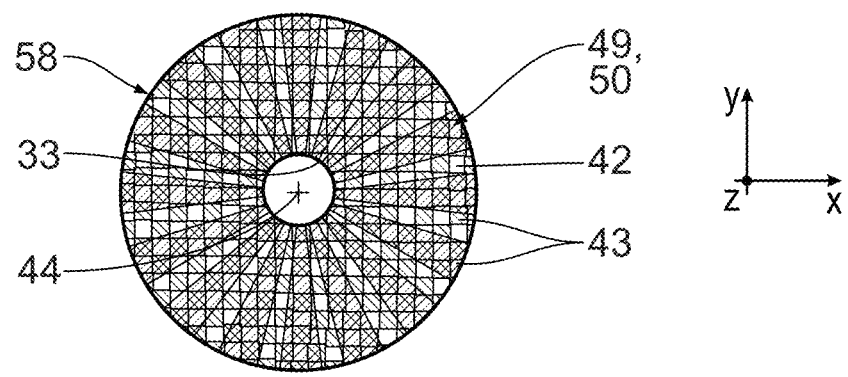

FIG. 18 shows another possible combination of two diffraction substructures to form a further variant of a diffraction structure 58. The two diffraction substructures combined with one another are, firstly, the spoke-like diffraction substructure 49 according to FIG. 9 and, secondly, the grid-like diffraction substructure 50 according to FIG. 10. These two diffraction substructures also differ in their symmetry conditions since none of the aforementioned criteria are met.

Figure 19:
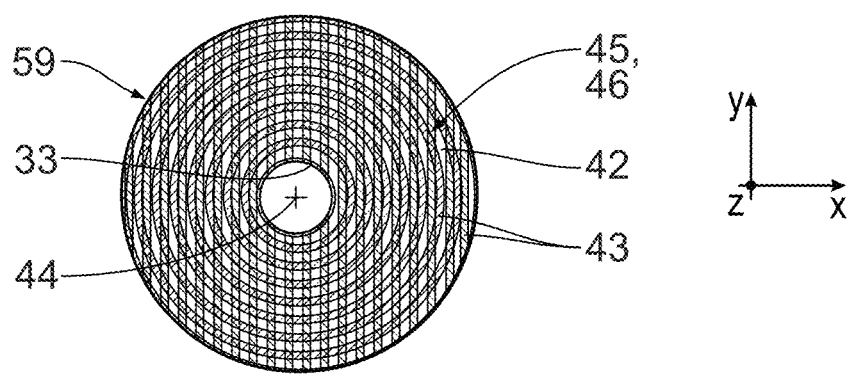

FIG. 19 shows a further variant of a diffraction structure 59, formed as a combination of the linear diffraction substructure 46 according to FIG. 6 and the circular path-shaped diffraction substructure 45 according to FIG. 5. These two diffraction substructures 45, 46 also do not meet any of the three criteria listed above, and so their symmetry conditions differ.

Figure 20:
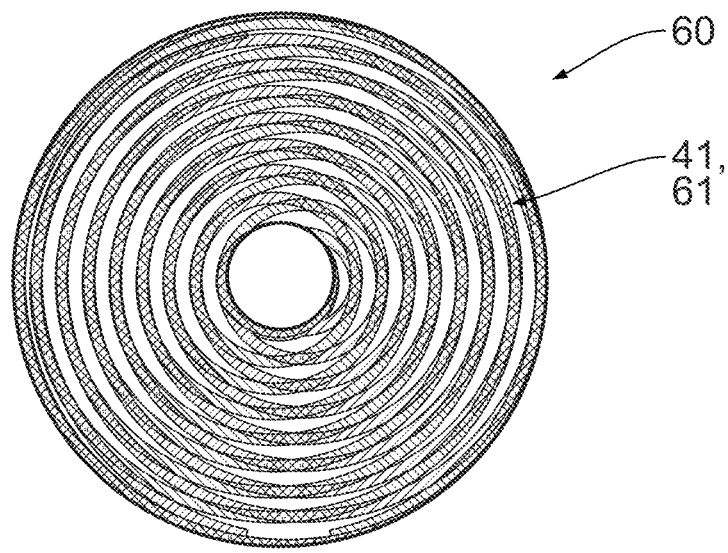

FIG. 20 shows a further variant of a diffraction structure 60 formed as a combination of two diffraction substructures, namely the spiral-path-shaped diffraction substructure 41 and a further spiral-path-shaped diffraction substructure 61 with an opposite helical running direction. While a helical running direction runs radially from the inside to the outside in an anticlockwise direction in the diffraction substructure 41, the helical running direction is radially from the inside to the outside in a clockwise direction in the diffraction substructure 61.

None of the above criteria are met in the case of the two diffraction substructures 41, 61, the superposition of which forms the diffraction structure 60, with the result that the two diffraction substructures 41, 61 differ in their symmetry conditions.

The superposition of the diffraction substructures of the diffraction structures 57 to 60 results in structure portions with the depth of one of the negative diffraction structures, that is to say either the depth of the negative diffraction structure 43 of the first diffraction substructure or the depth of the negative diffraction structure 43 of the second diffraction substructure, and structure portions with a structure depth that corresponds to the sum of the structure depths of the two negative diffraction structures of the two diffraction substructures.

A structure depth of the two diffraction substructures can differ, insofar as the two diffraction substructures are designed for the diffraction of different wavelengths. In the case of different target wavelengths $\lambda_i$, $\lambda_j$, one diffraction substructure can have a structure depth of $\lambda_i/4c$ and the other of the two diffraction substructures can have a structure depth of $\lambda_j/4c$, for example. In the structure regions in which the negative diffraction structures 43 of the two diffraction substructures are superimposed, a structure depth of $(\lambda_i+\lambda_j)/4c$ then emerges. In this regard, reference is also made to the above explanations in relation to equation (1).

Figure 21:
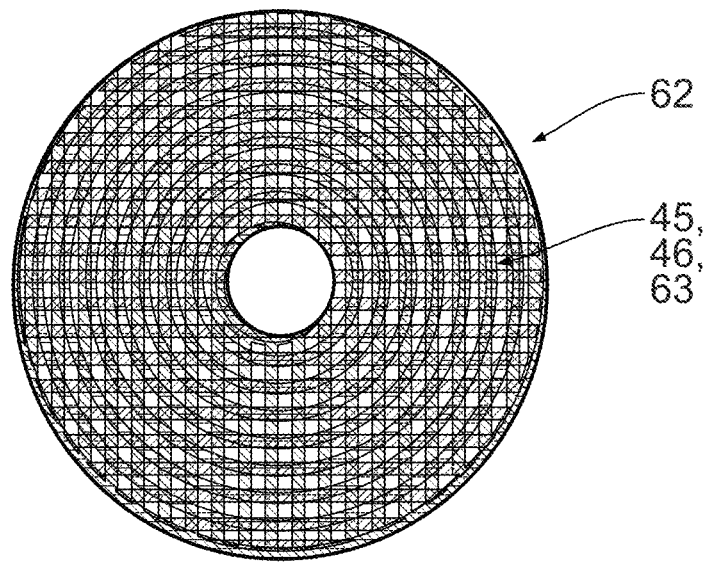
FIG. 21 shows a top view of a further embodiment of a diffraction structure with three diffraction substructures, each of which has positive diffraction structures and negative diffraction structures, with the arrangement of these structures of the three diffraction substructures following different symmetry conditions.

FIG. 21 shows a variant of a diffraction structure 62 which is a superposition of three diffraction substructures, namely the diffraction substructure 46 (vertical lines), the diffraction substructure 45 (circular paths) and a further diffraction substructure, for example arising by pivoting the diffraction substructure 46 through 90° about the structure origin 44 in the plane of the drawing in FIG. 6, with the result that horizontally extending positive diffraction structures 42 and negative diffraction structures 43 emerge. This horizontal line diffraction substructure is referred to as diffraction substructure 63 hereinafter.

The diffraction substructures 45 and 46 have different symmetry conditions since they do not meet the criteria explained above in connection with FIG. 17.

Due to the superposition of three diffraction substructures 45, 46, 63, there are structure regions in the diffraction structure 61 in which exactly one of the three negative diffraction structures 43, respectively one of the diffraction substructures 45, 46, 63, is present, structure regions in which exactly two of these negative diffraction structures 43 of the three diffraction substructures 45, 46, 63 are superimposed on one another, and structure regions in which all three negative diffraction structures 43 of the diffraction substructures 45, 46 and 63 are superimposed on one another.

Depending on the wavelength $\lambda_i$, $\lambda_j$, $\lambda_k$ for which the diffraction substructures 45, 46, 63 are designed, this therefore results in structure regions with a structure depth of $\lambda_i/4c$, structure regions with a structure depth of $\lambda_j/4c$, structure regions with a structure depth of $\lambda_k/4c$, structure regions with a structure depth of $(\lambda_i+\lambda_j)/4c$, structure regions with a structure depth of $(\lambda_j+\lambda_k)/4c$, structure regions with a structure depth of $(\lambda_i+\lambda_k)/4c$, and structure regions with a structure depth of $(\lambda_i+\lambda_j+\lambda_k)/4c$.

The following may apply to the wavelengths $\lambda_i$, $\lambda_j$: $\lambda_i=10$ µm, that is to say for example the wavelength of the pump light 29, and $\lambda_j=1$ µm, that is to say the wavelength of another pump light source 30, for example for a pre-pulse.

The following may apply to the third wavelength $\lambda_k$: $\lambda_k$=0.1 µm, that is to say the wavelength of an EUV radiation component generated parasitically by the light source 3.

In a further variant, not shown here, a diffraction structure can also be formed as a superposition of four different diffraction substructures.

A first diffraction substructure can be formed in the manner of the diffraction substructure 46 and can have a structure depth for suppressing a target wavelength of the order of 10 µm. A second diffraction substructure can be designed like the third diffraction substructure 63 of the diffraction structure 62 explained above in connection with FIG. 21, with horizontal positive diffraction structures and negative diffraction structures, and can have a structure depth for suppressing a target wavelength of 1 µm. A third diffraction substructure may be spoke-shaped in the manner of diffraction substructure 47 according to FIG. 7 and designed to suppress a target wavelength of 150 nm, in order to provide a first parasitic DUV wavelength. A fourth diffraction substructure can be designed, in turn, in the manner of the diffraction substructure 47 according to FIG. 7 but with a different structure depth, in order to suppress a further parasitic DUV wavelength of 250 nm. All four diffraction substructures are then designed to suppress four different target wavelengths.

Another combination of the diffraction substructure types, selected from the diffraction substructure types explained above in connection with FIGS. 4 to 21, is also possible.

In a further embodiment of a diffraction structure with a total of three superimposed diffraction substructures, two of the diffraction substructures are of the circular path-type of diffraction substructure 45 according to FIG. 5, with the two diffraction substructures being embodied in terms of their structure depth for the purpose of suppressing two different target wavelengths of 10.6 µm and 10.2 µm, namely a pre-pulse and a main pulse wavelength of an embodiment of the plasma radiation source 3. In this variant of the diffraction structure, a third diffraction substructure is embodied as a spiral path-shaped diffraction substructure in the manner of the diffraction substructure 41 according to FIG. 4 and is again used to suppress a parasitic DUV wavelength of 150 nm.

In order to produce a microstructured or nanostructured component, the projection exposure apparatus 1 is used as follows: First, the reflection mask 7 or the reticle and the substrate or the wafer 13 are provided. Subsequently, a structure on the reticle 7 is projected onto a light-sensitive layer of the wafer 13 with the aid of the projection exposure apparatus 1. Then, a microstructure or nanostructure on the wafer 13, and hence the microstructured component, is produced by developing the light-sensitive layer.

What is claimed is:

1. An optical component, comprising:
   a diffraction structure configured to diffractively influence a direction of emergence of light of at least one wavelength incident on the optical component,
   wherein:
   the diffraction structure comprises first and second diffraction substructures;
   the first and second diffraction substructures are superimposed in at least one portion of the optical component;
   the first diffraction substructure comprises first positive diffraction structures and first negative diffraction structures;
   the first positive diffraction structures and the first negative diffraction structures follow a first symmetry condition;
   the second diffraction substructure comprises second positive diffraction structures and second negative diffraction structures;
   the second positive diffraction structures and the second negative diffraction structures follow a second symmetry condition; and
   the second symmetry condition is different from the first symmetry condition.

2. The optical component of claim 1, wherein the first and second diffraction substructures are configured to diffractively influence different light wavelengths.

3. The optical component of claim 1, wherein first diffraction substructure has a periodic structure, and the second diffraction substructure has an aperiodic structure.

4. The optical component of claim 1, wherein the first diffraction substructure has a rotational symmetry about a structure origin.

5. The optical component of claim 4, wherein the second diffraction substructure has a rotational symmetry about a structure origin.

6. The optical component of claim 1, wherein the first diffraction substructure has a spoke structure arranged around a structure origin.

7. The optical component of claim 6, wherein the second diffraction substructure has a spoke structure arranged around a structure origin.

8. The optical component of claim 1, wherein the first positive diffraction structures are arranged in a grid-like manner.

9. The optical component of claim 8, wherein the first negative diffraction structures are arranged in a grid-like manner.

10. The optical component of claim 1, wherein the first diffraction substructure comprises a binary structure.

11. The optical component of claim 10, wherein the second diffraction substructure comprises a binary structure.

12. The optical component of claim 1, wherein cross-sectional structural transitions between the first positive diffraction structures and the first negative diffraction structures have a smooth profile.

13. The optical component of claim 12, wherein cross-sectional structural transitions between the second positive diffraction structures and the second negative diffraction structures have a smooth profile.

14. The optical component of claim 1, wherein:
   the diffraction structure further comprises third diffraction substructure;
   the third diffraction substructure comprises third positive diffraction structures and third negative diffraction structures;
   the third positive diffraction structures and the third negative diffraction structures follow a third symmetry condition;
   the third symmetry condition is different from the first symmetry condition; and
   the third symmetry condition is different from the second symmetry condition.

15. The optical component of claim 14, wherein each of the first, second and third diffraction substructures are configured to diffractively influence different light wavelengths.

16. A collector, comprising:
   an optical component according to claim 1,
   wherein the collector is configured to guide EUV used light emitted by a plasma source region, at least one structured stray light portion of an impingement surface of the collector is configured to lead away stray light radiation by diffraction, and the wavelength of the stray light differing from that of the EUV used light.

17. An illumination system, comprising:
a collector comprising an optical component according to claim 1, wherein the collector is configured to guide EUV used light emitted by a plasma source region, at least one structured stray light portion of an impingement surface of the collector is configured to lead away stray light radiation by diffraction, and the wavelength of the stray light differing from that of the EUV used light; and
an illumination optical unit configured to illuminate an object field with the used EUV light as illumination light.

18. An optical system, comprising:
a collector comprising an optical component according to claim 1, wherein the collector is configured to guide EUV used light emitted by a plasma source region, at least one structured stray light portion of an impingement surface of the collector is configured to lead away stray light radiation by diffraction, and the wavelength of the stray light differing from that of the EUV used light;
an illumination optical unit configured to illuminate an object field with the used EUV light as illumination light; and
a projection optical unit configured to image the object field into an image field.

19. An apparatus, comprising:
an EUV light source;
a collector comprising an optical component according to claim 1, wherein the collector is configured to guide EUV used light emitted by a plasma source region, at least one structured stray light portion of an impingement surface of the collector is configured to lead away stray light radiation by diffraction, and the wavelength of the stray light differing from that of the EUV used light;
an illumination optical unit configured to illuminate an object field with the used EUV light as illumination light; and
a projection optical unit configured to image the object field into an image field.

20. A method of using an apparatus comprising an EUV light source, a collector, an illumination optical unit and a projection optical unit, the method comprising:
using the apparatus to illuminate a reticle in an object field and project a structure of the reticle into an image field in which a light-sensitive layer of a wafer is present, wherein the illumination optical unit comprises an optical component according to claim 1.

* * * * *

UNITED STATES PATENT AND TRADEMARK OFFICE
CERTIFICATE OF CORRECTION

PATENT NO. : 12,326,663 B2
APPLICATION NO. : 18/187295
DATED : June 10, 2025
INVENTOR(S) : Valentin Jonatan Bolsinger Page 1 of 1

It is certified that error appears in the above-identified patent and that said Letters Patent is hereby corrected as shown below:

In the Specification

Column 11, Line 7, after "40" insert -- . --.

Column 11, Line 47, delete "λn (n=1, . . . N)" and insert -- λn(n=1, . . . N) --.

Column 12, Lines 28-33, delete 
"$I(\lambda, k) = \left| \int_{-\infty}^{\infty} \int_{-\infty}^{\infty} e^{irk} e^{i4\pi c(x,y)\frac{A_n(x,y)}{\lambda}} dxdy \right|^2 = |FT[f_1] * FT[f_2] * ... * FT[f_N]|^2$" and insert -- $I(\lambda, k) = \left| \int_{-\infty}^{\infty} \int_{-\infty}^{\infty} e^{irk} e^{i4\pi c(x,y)\frac{A(x,y)}{\lambda}} dxdy \right|^2 = |FT[f_1] * FT[f_2] * ... * FT[f_N]|^2$ --.

Column 16, Line 27, delete "(λi+λi)/" and insert -- (λi+λj)/ --.

Signed and Sealed this
Twenty-second Day of July, 2025

Coke Morgan Stewart
*Acting Director of the United States Patent and Trademark Office*